METHOD FOR APPLYING METAL CONTACTS ONTO DIODE ARRAY

Filed Dec. 22, 1969

INVENTOR
J. R. RUSHTON
BY Charles E. Graves
ATTORNEY

United States Patent Office 3,674,498

Patented July 4, 1972

3,674,498
METHOD FOR APPLYING METAL CONTACTS ONTO DIODE ARRAY

John R. Rushton, Temple, Pa., assignor to Bell Telephone Laboratories, Inc., Murray Hill, N.J.

Filed Dec. 22, 1969, Ser. No. 887,206
Int. Cl. G03c; G03b
U.S. Cl. 96—119 3 Claims

ABSTRACT OF THE DISCLOSURE

A process is disclosed for applying metal contacts over a diode type storage device. An X–Y array of square metal contacts is formed on the diode-containing surface. The diode array and the square array require no registration other than a preselected relative orientation.

FIELD OF THE INVENTION

This invention relates to semiconductor light sensitive storage devices; and particularly to microdiode array target structures used in certain television camera tubes.

BACKGROUND OF THE INVENTION

In Pats. 3,403,284, issued to T. M. Buck et al. and 3,440,477, issued to M. H. Crowell et al., both assigned to applicant's assignee, there is described a television camera tube comprising a diode array target comprising p-type regions contained in a slab of n-type semiconductor. With the n-type substrate maintained at a positive voltage, an electron beam scans the surface containing the p-regions, thereby reverse biasing the p-n junctions. Illumination of the substrate causes the production of electron-hole pairs which increase the rate of discharge of the diodes. The next scan of the electron beam causes current to flow, equal to the recharging current of the diode junctions. This current flow creates a voltage across a resistor which is taken as the output video signal.

In one form of the Buck et al. invention, large diameter metal contacts are applied to the relatively smaller p-type regions to increase the diode capacitance, as well as the charge each diode may collect from the beam. In constructing this embodiment, it has heretofore been necessary to achieve proper registration between the metal contacts and the diodes of the array. The requisite precision involves, however, an added and somewhat complex process step.

Accordingly a principal object of the invention is to eliminate the need for registration between a diode array and the corresponding metal islands in a device of the type described.

SUMMARY OF THE INVENTION

These and other objects are achieved by applying—through suitable evaporation, photoresist and etching techniques—an array of metal polygons arranged in rows and columns, with the polygon maximum cross section chosen to normally fit, in any orientation, into the space between two diodes in the diode array.

The polygons are applied without regard to their registration with respect to the underlying diodes, and with a relative pattern rotation of the order of 10 degrees, the specific rotation being readily controllable but not necessarily critical.

Advantageously, the metal polygons are in the shape of squares with a center-to-center spacing that covers from 20 percent to 70 percent of the available area. The square size, square spacing, diode radius, diode spacing, and angular orientation between the two patterns are optimized to achieve a minimum of shorts, or squares which connect two diodes; and opens, or squares which connect to no diodes. The spacing of any moiré pattern which might result from the superposition of the array of metal contacts onto the array of diodes is taken into account in the optimization process.

Accordingly, one feature of the invention is that metal squares are used as contacts for which the center-to-center spacing is different from that of the diodes.

A further feature of the invention is that the metal polygon array is randomly placed with respect to the diode array, but at a slight angle with respect thereto.

The invention and its further objects, features, and advantages will be readily apprehended from a reading of the detailed description to follow of an illustrative embodiment thereof.

THE DRAWING

DETAILED DESCRIPTION OF AN ILLUSTRATIVE EMBODIMENT

Figure 1:
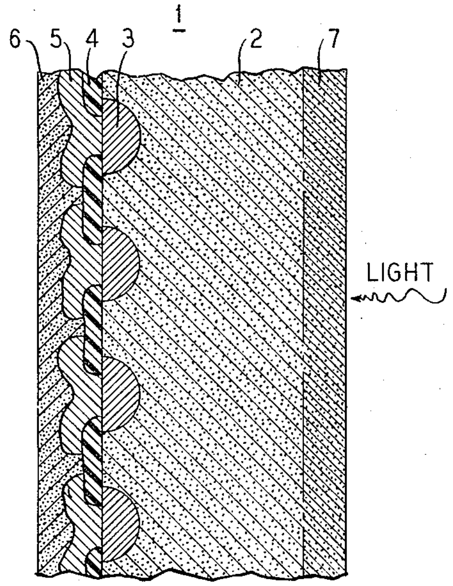
FIG. 1 is a side sectional view through a device employing the present invention.

The version of the diode array target to which the present invention is addressed is described in the Crowell et al. Pat. 3,440,477. Such a diode array target is depicted in FIG. 1. The device designated 1, comprises an n-type semiconductor substrate 2, with discrete p-type regions 3 uniformly spaced in an X–Y matrix on the target surface. An insulative coating 4 of, for example, silicon dioxide, covers the target side leaving, however, the regions 3 substantially exposed.

A diode junction exists between the substrate 2 and the regions 3. Metal contacts 5 are placed over the regions 3 so as to cover most of the insulative coating 4 with metal, while keeping most of the regions 3 unconnected. The procedure involves conventional steps including metal evaporation, applying photoresist and exposing through a mask, developing, etching, and washing.

A semi-insulating layer 6, for example antimony trisulfide, is evaporated over the entire surface on which the electron beam impinges for the purpose of moderating charge accumulation. Also, an n-plus region 7 is formed in the light-receiving surface for the purpose of creating an internal field effect that will tend to prevent recombination of the minority carriers (holes) produced by light.

The manner of fabricating device 1 and of electrically connecting same to external circuitry is fully described in Pat. 3,403,284, which to the extent relevant is incorporated herein by reference.

Figure 2:
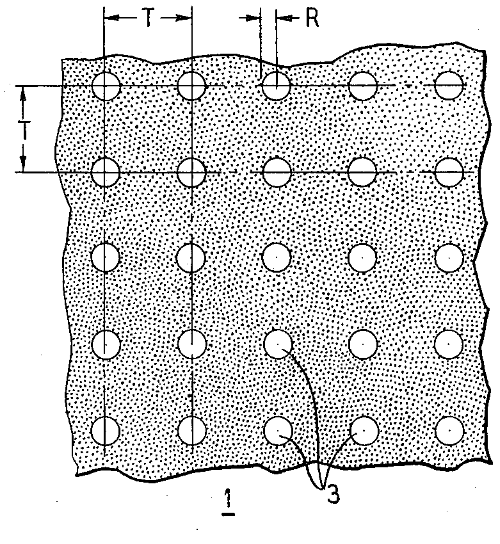
FIGS. 2 and 3 are schematic partial top views of the device diode pattern and the contact mask pattern.
Figure 3:
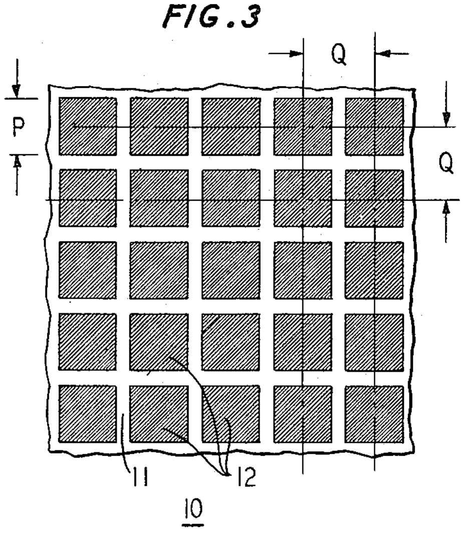

FIG. 2 depicts schematically a portion of the diode junction array as surrounded by coating 4. The exposed portions of the diodes have a radius denoted R and a center-to-center spacing T. FIG. 3 depicts a portion of a photomask 10 used to create the contacts 9 which in the instant embodiment are square in shape. The photomask 10 accordingly includes transparent area 11 and opaque squares 12 for use with positive photoresist. The dimension of each square side is denoted P while the square center-to-center spacing is denoted Q.

Figure 4:
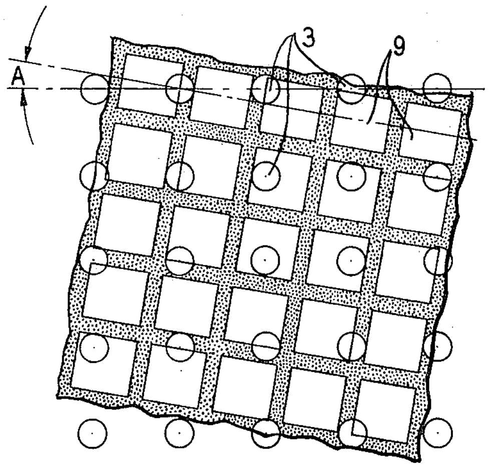
FIG. 4 is a schematic partial top view of the contacts applied according to the invention.

FIG. 4 shows the contacts 9, applied to the diodes in accordance with this invention. Ideally, P is chosen with respect to R and T, so that in any orientation no square can contact more than one diode. The square spacing Q thus is different from the diode spacing T. Within this constraint, it is desirable to make the square side P as large as possible and the separation between squares (Q–P) as small as possible so as to provide the largest metallic film coverage. Each region 3 is contacted by at least one square 9, up to four squares.

The following example is illustrative of the invention's practice.

EXAMPLE 1

An n-type silicon substrate 15 mils thick was etched and optically polished on one side. A layer of silicon dioxide was formed on the polished side, and an array of apertures was etched therein. p-Type regions were then formed by diffusing boron into the exposed areas of the substrate. The target was thinned down to a thickness of 15$\mu$ by etching of the back side. An n-plus layer was formed in the light-receiving surface by diffusion of phosphorous. Then, a layer of 3000 A. thick aluminum was deposited on the diode-containing surface, using filament evaporation. The aluminum layer was next processed for etching and the creation of square metal contacts.

The mask 10 orientation angle A was randomly set as in FIG. 4 in the range of 25 to 35 degrees. After exposure and development, the aluminum was etched in an electrolytic bath of trimethyl ammonium hydroxide, resulting in contacts in the form of squares. A coating of $Sb_2S_3$, 1500 A. thick was then applied over the entire front surface.

The mask used represented values of P=14$\mu$, Q=19$\mu$ on a diode array where R=4$\mu$ and T=15$\mu$. This square geometry was, for demonstration purposes, double what would normally be desirable. Even so, no white video defects of the type caused by pinholes in the oxide were introduced by the metal island. Any moiré pattern stemming from the superimposition of the two differently spaced networks is not visible since its spacing is less than the beam diameter of about 50$\mu$. The device produced per Example 1 was tested for saturation current i.e., the maximum signal current obtained when the target was flooded with light. As compared to the value measured before the metal contacts were applied, the saturation current was strikingly increased. This is evidently due to increase in diode capacitance caused by the presence of the metal contacts, and the corresponding increase in charge storage capability. Since the electron beam remains in contact with each p-region for a longer period, the ability of the beam to establish the full value of reverse bias is also enhanced.

A substantial benefit of the present invention is the much reduced tendency of the silicon surface between the diodes to invert, or change in conductivity type. Such inversion stems from the need to normally maintain a very low positive charge on the oxide coating 4. With the onset of inversion the resolution of the target is lost.

However, in the present invention, saturation current is not artificially limited by inversion. The presence of the metal contacts extending out over the oxide controls the silicon-silicon dioxide interface potential, inhibiting the formation of an inversion layer and thus preserving the resolution of the device up to considerably higher target voltages.

The ideal pattern of metal contacts would connect all contacts to no more than one diode, and all diodes to from 1 to 4 contacts. In practice, however, shorts between diodes, and opens, will occur.

Specifically, with an increasing angle A, both the number of shorts and the number of opens increases, while the moiré fringe spacing decreases. The optimum geometry is that which produces the largest area coverage with the smallest numbers of shorts and opens, consistent with the major requirement that any generated moiré pattern have a fringe spacing smaller than the electron beam diameter. The principal moiré spacing of interest is given by Equation 1 where L is the moiré spacing and the other parameters are as previously defined.

$$\frac{1}{L^2}=\frac{1}{Q^2}+\frac{1}{T^2}-\frac{2\cos A}{QT} \qquad (1)$$

Thus with a given diode spacing T and contact spacing Q an angle A can be calculated which will render L less than the beam diameter (50$\mu$ for example). The only restriction on the positioning of the contact array over the diode array is then that the relative orientation should not be less than this value. Advantageously the angle should not exceed this value by more than 10 degrees. For an electron beam diameter of 50$\mu$ and an array of 8$\mu$ diameter diodes with center-to-center spacing of 15$\mu$, a range of contact sizes of square side of from 7$\mu$ to 14$\mu$ and center-to-center spacing from 9.5$\mu$ to 19$\mu$ gives satisfactory results. For a contact center-to-center spacing of 9.5$\mu$ any angle except zero is allowable since the maximum moiré spacing possible is about 26$\mu$. For a contact spacing of 19$\mu$ the angle A should not be less than approximately 14 degrees.

The spirit of the invention is embraced in the scope of the claims which follow.

What is claimed is:

1. In the manufacture of diode-array type storage devices, a process for producing metal islands over the diodes comprising the step of producing through evaporation, photoresist and etching techniques over said diodes a pattern of squares in an off-axis orientation, characterized in that substantially each such square fit in any orientation between any two diodes without shorting them, and in that each diode is contacted by at least one said square up to a maximum of four squares.

2. In the manufacture of diode X–Y array type storage devices, a process for producing metal contacts over the diodes comprising producing through evaporation, photoresist and etching techniques an X–Y array of metal contacts over the diode-containing surface, characterized in that the island-producing mask is substantially randomly placed except for maintaining an orientation between said arrays of an amount determined by the tolerable moiré spacing with a given diode spacing and contact spacing.

3. The process of claim 2 wherein said metal contacts are square shaped.

References Cited

UNITED STATES PATENTS

| | | | |
|---|---|---|---|
| 3,403,284 | 9/1968 | Buck et al. | 315—11 |
| 3,440,477 | 4/1969 | Crowell et al. | 313—66 |
| 3,517,246 | 6/1970 | Chester et al. | 313—66 |

NORMAN G. TORCHIN, Primary Examiner

E. C. KIMLIN, Assistant Examiner

U.S. Cl. X.R.

315—10, 66